United States Patent
Taguchi et al.

(10) Patent No.: US 8,336,005 B2
(45) Date of Patent: Dec. 18, 2012

(54) PATTERN DIMENSION CALCULATION METHOD AND COMPUTER PROGRAM PRODUCT

(75) Inventors: Takafumi Taguchi, Kanagawa (JP); Toshiya Kotani, Tokyo (JP); Hiromitsu Mashita, Kanagawa (JP); Fumiharu Nakajima, Kanagawa (JP); Ryota Aburada, Kanagawa (JP); Chikaaki Kodama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 40 days.

(21) Appl. No.: 13/050,864

(22) Filed: Mar. 17, 2011

(65) Prior Publication Data

US 2011/0307845 A1   Dec. 15, 2011

(30) Foreign Application Priority Data

Jun. 14, 2010   (JP) .................. 2010-134655

(51) Int. Cl.
*G06F 17/50* (2006.01)
(52) U.S. Cl. .................. 716/54; 716/51; 716/55; 430/5; 430/30
(58) Field of Classification Search .......... 716/51, 716/54, 55; 430/5, 30
See application file for complete search history.

(56) References Cited

U.S. PATENT DOCUMENTS

| | | | | |
|---|---|---|---|---|
| 5,416,729 A | * | 5/1995 | Leon et al. ................ | 716/51 |
| 6,586,755 B1 | * | 7/2003 | Krivokapic et al. ...... | 250/492.21 |
| 7,123,414 B2 | * | 10/2006 | Sentoku et al. ............... | 359/566 |
| 7,864,343 B2 | * | 1/2011 | Finarov et al. ................ | 356/625 |
| 7,923,260 B2 | * | 4/2011 | Moon et al. .................... | 436/164 |
| 8,171,434 B2 | * | 5/2012 | Iyanagi .......................... | 716/53 |
| 2008/0204730 A1 | * | 8/2008 | Yu et al. ........................ | 356/128 |
| 2009/0087757 A1 | * | 4/2009 | Onoue ............................. | 430/5 |
| 2009/0089727 A1 | | 4/2009 | Iyanagi | |
| 2010/0144148 A1 | * | 6/2010 | Fukuhara et al. ............. | 438/689 |
| 2010/0151364 A1 | * | 6/2010 | Ye et al. ............................ | 430/5 |
| 2010/0243431 A1 | * | 9/2010 | Kuboi et al. ............. | 204/192.33 |
| 2011/0122994 A1 | * | 5/2011 | Grubsky et al. ................. | 378/62 |
| 2011/0143271 A1 | * | 6/2011 | Koshiba et al. ................. | 430/30 |

FOREIGN PATENT DOCUMENTS

| | | |
|---|---|---|
| JP | 07-193056 | 7/1995 |
| JP | 2007-219208 | 8/2007 |
| JP | 2009-080349 | 4/2009 |
| JP | 2009-259892 | 11/2009 |

* cited by examiner

*Primary Examiner* — Naum Levin
(74) *Attorney, Agent, or Firm* — Finnegan, Henderson, Farabow, Garrett & Dunner, L.L.P.

(57) ABSTRACT

A pattern dimension calculation method according to one embodiment calculates a taper shape of a mask member used as a mask when a circuit pattern is processed in an upper layer of the circuit pattern formed on a substrate. The method calculates an opening angle facing the mask member from a shape prediction position on the circuit pattern on the basis of the taper shape. The method calculates a dimension of the circuit pattern according to the opening angle formed at the shape prediction position.

20 Claims, 8 Drawing Sheets

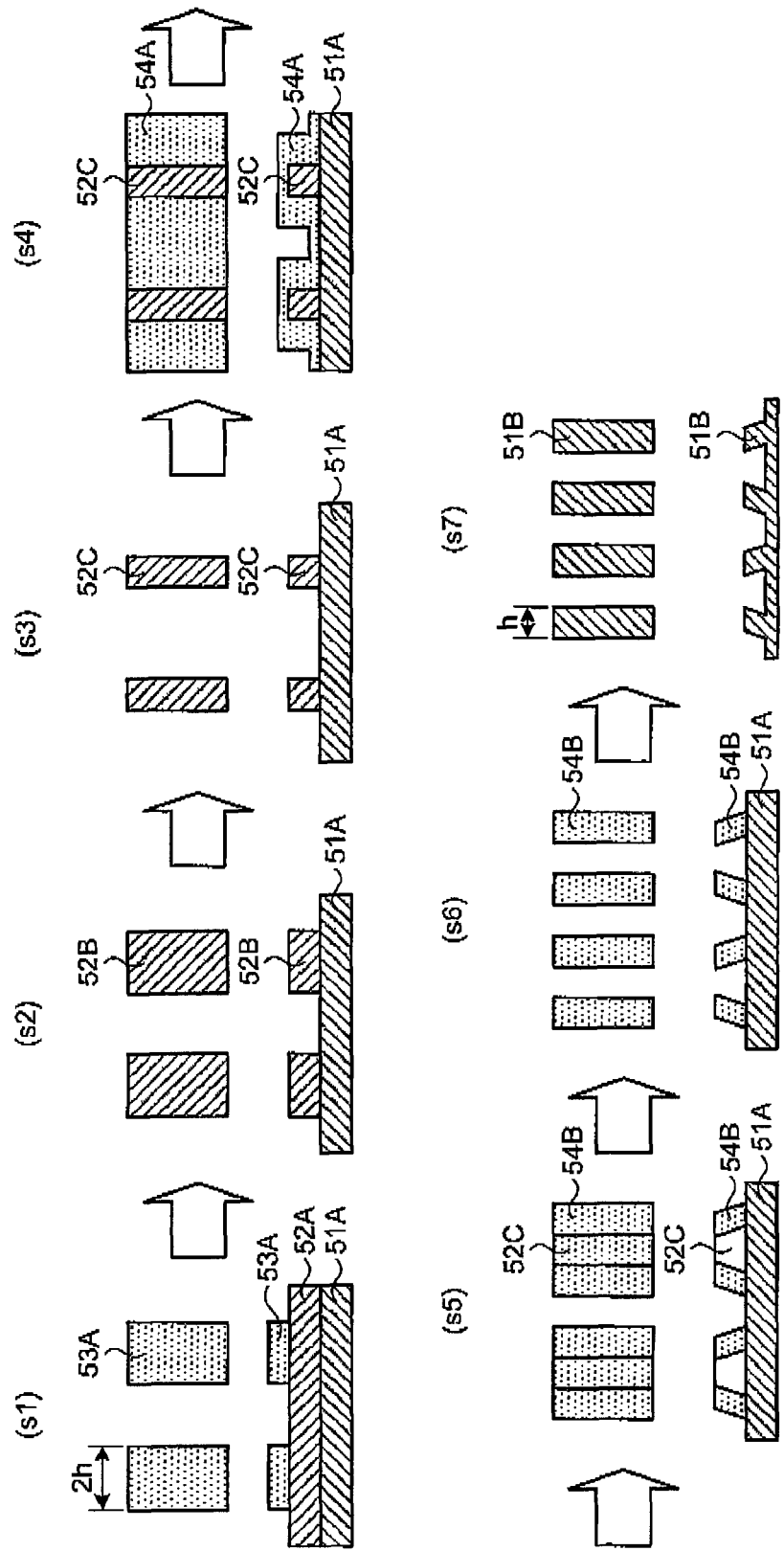

PATTERN DIMENSION CALCULATION METHOD AND COMPUTER PROGRAM PRODUCT

CROSS-REFERENCE TO RELATED APPLICATIONS

This application is based upon and claims the benefit of priority from the prior Japanese Patent Application No. 2010-134655, filed on Jun. 14, 2010; the entire contents of which are incorporated herein by reference.

FIELD

Embodiments described herein relate generally to a pattern dimension calculation method and a computer program product.

BACKGROUND

With the recent advancements in miniaturization of semiconductor device, defects due to variation of manufacturing or particles increase, so that it is very difficult to improve a yield rate. A method for shortening the wavelength of light source (exposure light rays) and a method for increasing the numerical aperture (NA) of lens cannot catch up with the miniaturization of semiconductor device which advances at an accelerated pace. In such a conventional technique, it is desired that a post-process dimension of a pattern is predicted at a high degree of accuracy regardless of the shape of the pattern.

BRIEF DESCRIPTION OF THE DRAWINGS

FIG. 7 is a diagram illustrating a process flow of a side wall processing process;

DETAILED DESCRIPTION

Figure 1A:
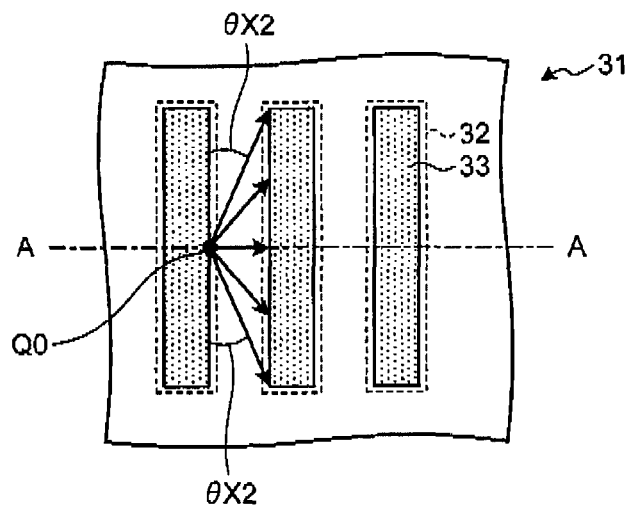
FIGS. 1A to 1C are illustrations for explaining a concept of post-process dimension calculation processing according to a first embodiment.

A pattern dimension calculation method according to embodiments calculates a taper shape of a mask member used as a mask when a circuit pattern is processed in an upper layer of the circuit pattern formed on a substrate. The method calculates an opening angle facing the mask member from a shape prediction position on the circuit pattern on the basis of the taper shape. The method calculates a dimension of the circuit pattern according to the opening angle formed at the shape prediction position.

Hereinafter, the pattern dimension calculation method and the computer program product according to the embodiments will be described in detail with reference to the drawings. These embodiments do not limit the present invention. In the drawings, the same constituent elements are given the same reference numerals and detailed descriptions thereof will be properly omitted.

(First Embodiment)

First, a concept of the post-process dimension calculation processing (pattern dimension calculation processing) will be described. FIG. 1 is an illustration for explaining a concept of post-process dimension calculation processing according to a first embodiment. The post-process dimension calculation processing according to this embodiment is performed by using a process simulation of a substrate. The post-process dimension calculation processing is applied to a manufacturing process of a semiconductor device in which a semiconductor integrated circuit pattern is formed on a substrate by processing a film to be processed (such as an insulating film described below) at least once.

Figure 1B:
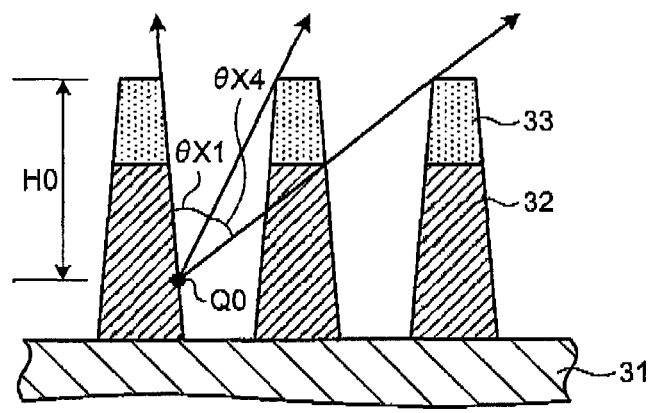
Figure 1C:
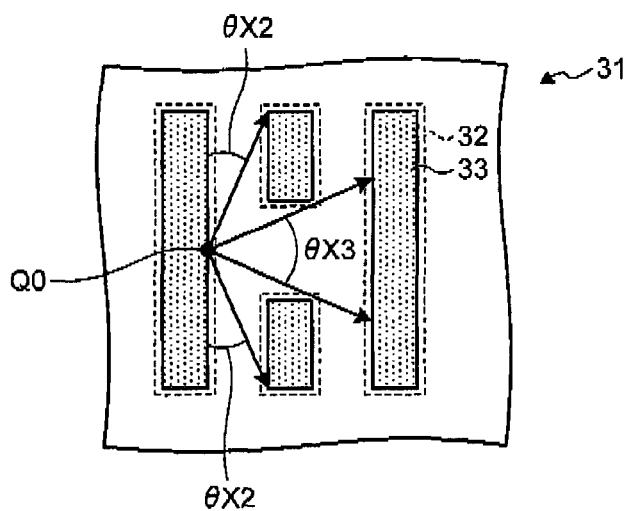

FIGS. 1A to 1C show schematic diagrams for illustrating the post-process dimension prediction method according to the first embodiment. FIG. 1A illustrates a schematic plan view (top view) of a wafer 31 on which a pattern (circuit pattern) of a semiconductor integrated circuit or the like is formed. The FIG. 1B illustrates a cross-sectional view taken along line A-A in FIG. 1A. FIG. 1C illustrates a schematic plan view of a wafer 31 on which a pattern arranged intermittently is formed.

If a resist pattern 33 corresponding to a design pattern is transferred on a substrate such as a wafer 31 without change, a post-process pattern (pattern of an insulating film) 32 having a pattern shape different from the pattern shape of the resist pattern 33 is formed on the wafer 31. For example, if the post-process pattern 32 is formed by using the resist pattern 33 as a mask, there may be phenomena such as the line length of the post-process pattern 32 is shortened, the line length is elongated, and a corner is rounded. One of the factors that cause such phenomena (dimension conversion difference) is a process conversion difference due to an effect of etching (for example, pattern dependence of the etching rate).

In order to achieve desired electrical characteristics as a semiconductor device, failures due to breaks and bridges in the pattern have to be avoided. Therefore, dimensions and shapes just as the design pattern need to be realized on the wafer. Therefore, the post-process dimension of the pattern needs to be previously predicted to correct the pattern shape on a photomask used in a lithography process.

For example, the dimensional accuracy of the pattern desired to be formed is greatly affected by a layout environment of the other patterns placed therearound. Specifically, as the space length between patterns increases, the post-process dimension also increases. However, the space length and the post-process dimension are not necessarily proportional to each other. Further, the actual pattern shape is not necessarily limited to a linear pattern shape. Therefore, when the pattern shape is a nonlinear shape, an error is generated in the post-process dimension prediction.

As a result of study, the inventor has found that the accuracy of the post-process dimension prediction can be improved regardless of the pattern shape by obtaining the opening angle at a portion subjected to the post-process dimension prediction (hereinafter, this portion is referred to as a dimension prediction point) on the basis of design pattern data and analyzing the correlation between the opening angle and the actual measurement value of the post-process dimension to predict the post-process dimension.

The post-process dimension prediction method according to this embodiment will be described with reference to an example in which an insulating film formed on the wafer 31 is etched by using the resist pattern 33 as a mask and thereby the post-process pattern (circuit pattern) 32 is formed.

As illustrated in FIG. 1B, a position in the insulating film of the post-process pattern 32 is set as a dimension prediction point (shape prediction position) Q0, and when performing post-process dimension prediction, the opening angle at the dimension prediction point Q0 is obtained. The dimension prediction point Q0 is positioned at a distance H0 vertically downward (toward the wafer 1) from the top surface of the resist pattern 33. When the top surface of the post-process pattern 32 is the dimension prediction point Q0, the distance H0 has the same value as that of the thickness of the resist pattern 33. When the bottom surface of the formed post-process pattern 32 is the dimension prediction point Q0, the distance H0 has the same value as the sum of the thickness of the resist pattern 33 and the thickness of the post-process pattern 32. The dimension prediction point Q0 is set between a position at the same height as the top surface of the post-process pattern 32 and a position at the same height as the bottom surface of the post-process pattern 32 along the side surface (inclined surface) of the formed post-process pattern 32. The opening angle is determined for each position of the dimension prediction point Q0, and the pattern shape of the post-process pattern 32 is calculated for each position of the dimension prediction point Q0 by using the opening angle.

The opening angle is defined as an angle subtended by a portion of the sphere (space) swept by a half line (line segment) radiating from the dimension prediction point Q0, in which portion the half line does not interfere with the resist pattern 33 or the post-process pattern 32. In other words, when rotating the half line radiating from the dimension prediction point Q0 around the dimension prediction point Q0 so that the half line forms a sphere, a range in which the half line can rotate without hitting the other patterns is the opening angle. Thus, the opening angle is expressed by a solid angle. Such an opening angle can be determined on the basis of the design pattern data.

For convenience of description, the opening angle will be described with reference to a representative cross section of a solid (a part of the sphere) formed as described above. As illustrated in FIGS. 1A to 1C, an angle of a cross section formed by the half line (a range in which the half line can rotate) is expressed by a plane angle.

For example, the opening angle (plane angle) at the dimension prediction point Q0 perpendicular to the cross section of the wafer 31 is $\theta X1$ as illustrated in FIG. 1B. The opening angle (plane angle) at the dimension prediction point Q0 perpendicular to the top surface of the wafer 31 is $\theta X2$ as illustrated in FIG. 1A.

As illustrated in FIG. 1C, if the adjacent pattern has a broken portion, the opening angle increases from $\theta X2$ by $\theta X3$ as seen from above the top surface of the wafer 31. As illustrated in FIG. 1B, if the adjacent pattern has a broken portion, the opening angle increases from $\theta X1$ by $\theta X4$ as seen in a direction perpendicular to the cross section of the wafer 31.

Further, the opening angle $\theta X1$ varies with a distance (space) between the post-process patterns 32 at the same height as the distance prediction point Q0, a vertical position (distance H0) of the distance prediction point Q0, and a taper angle (taper shape) of the resist pattern 33. The taper angle of the resist pattern 33 is a pattern inclination angle determined by the dimensions of the bottom surface, the dimensions of the top surface, and the dimension of the height of the resist pattern 33. Thus, the longer the space length between the post-process patterns 32 is, the larger the opening angle $\theta X1$ is, and the smaller the distance H0 is, the larger the opening angle $\theta X1$.

Thus, if the relationship between the space length and the opening angle $\theta X1$ is analyzed for each vertical position (distance H0) of the dimension prediction point Q0 in advance, the opening angle $\theta X1$ is easily calculated using the distance H0 as a parameter.

Such an opening angle affects the amount of incident particles (for example, radicals and ions) at the dimension prediction point Q0, and becomes a factor for causing variation of the post-process dimensions. In other words, the larger the opening angle is, the larger the amount of incident particles that can come to the dimension prediction point Q0 is. Therefore, as the opening angle increases, a process conversion difference increases. As a result, the pattern length (line length) of the post-process pattern 32 tends to shorten.

Therefore, in the post-process dimension prediction processing, by considering both the opening angle and the incident angle, it is possible to know values of the post process dimensions reflecting a multi-direction layout environment. As a result of study, the inventor has found that the accuracy of the post-process dimension prediction can be improved regardless of the pattern shape by obtaining the amount of incident particles at the dimension prediction point on the basis of design pattern data and analyzing the correlation between the amount of incident particles and the actual measurement value of the post-process dimension to predict the post-process dimension.

Figure 2:
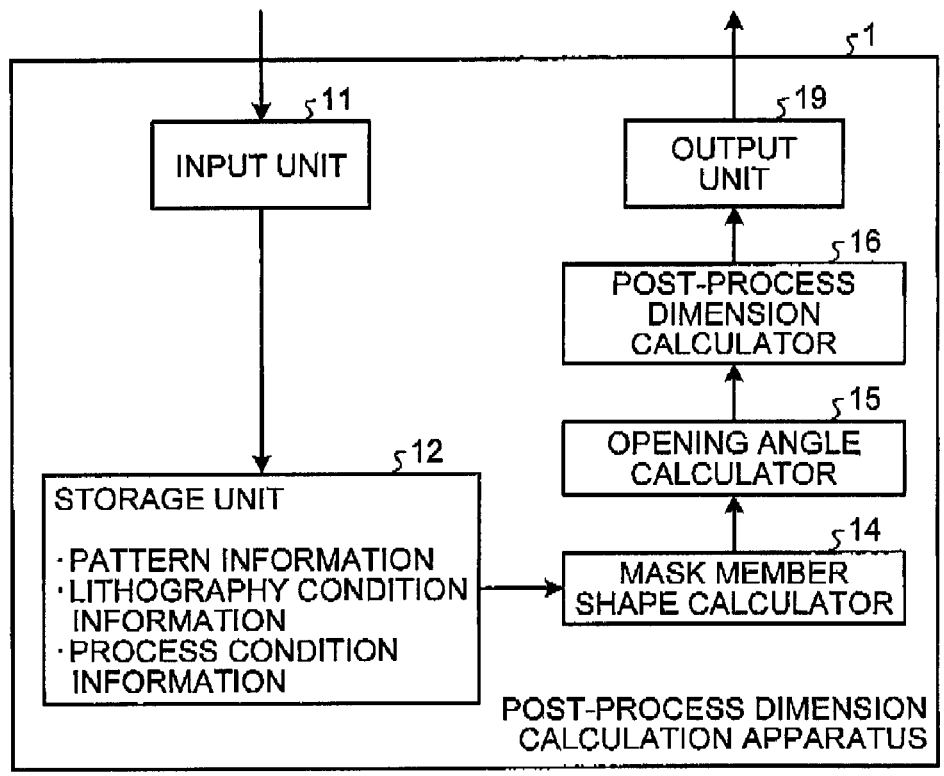
FIG. 2 is a block diagram illustrating a configuration of a post-process dimension calculation apparatus according to the first embodiment.

FIG. 2 is a block diagram illustrating a configuration of a post-process dimension calculation apparatus according to the first embodiment. The post-process dimension calculation apparatus (pattern dimension calculation apparatus) 1 includes an input unit 11, a storage unit 12, a mask member shape calculator 14, an opening angle calculator 15, a post-process dimension calculator 16, and an output unit 19.

Pattern information, lithography condition information, process condition information are input into the input unit 11, and the input unit 11 sends these information to the storage unit 12. The pattern information is information related to the pattern formed on the wafer 31. For example the pattern information includes design data of the post-process pattern 32, the film thickness of the resist of the resist pattern 33, the film thickness of the insulating film to be the post-process pattern 32, and the like. When the post-process pattern 32 is a line pattern, the pattern information includes at least one of the distance (space width) and solid angle between the adjacent line patterns, a pattern coverage rate around the line pattern, and the height of the line pattern.

The lithography condition information is information related to the lithography condition for forming the resist pattern on the wafer 31. For example, the lithography condition information includes the exposure condition, the resist coating condition, the material of the resist, and the development condition. The process condition information is information related to the etching for forming the post-process pattern 32, and includes the type of etchant, the etching time, and the like.

The storage unit 12 is a memory that stores the pattern information, the lithography condition information, the process condition information, and the like. The mask member shape calculator 14 predicts the shape of the resist pattern 33 on the basis of the pattern information (film thickness of the resist and the like) and the lithography condition information. The shape of the resist pattern 33 predicted by the mask member shape calculator 14 is a solid shape including a shape of the resist pattern 33 as seen from above the top surface and a cross-sectional shape of the resist pattern 33. The mask member shape calculator 14 sends the prediction result of the resist pattern 33 to the opening angle calculator 15.

The opening angle calculator 15 calculates the opening angle at the dimension prediction point on the basis of the prediction result of the resist pattern 33, the pattern information (film thickness of the insulating film and the like), and the process condition information. The opening angle calculated by the opening angle calculator 15 is an opening angle when seeing the resist pattern 33 from above the top surface and an opening angle when seeing the resist pattern in a direction perpendicular to the cross section. The opening angle calculator 15 sends the calculated opening angles to the post-process dimension calculator 16.

The post-process dimension calculator 16 predicts the shape of the post-process pattern 32 on the basis of the opening angles, the pattern information, and the prediction result of the resist pattern 33. The shape of the post-process pattern 32 predicted by the post-process dimension calculator 16 is a solid shape including a shape of the post-process pattern 32 as seen from above the top surface and a cross-sectional shape of the post-process pattern 32. The post-process dimension calculator 16 sends the prediction result of the post-process pattern 32 (post-process dimensions) to the output unit 19.

In the post-process dimension calculation apparatus 1, the setting processing of the dimension prediction point, the calculation processing of the opening angles by the opening angle calculator 15, and the shape prediction processing of a halfway processed post-process pattern 32 by the post-process dimension calculator 16 are sequentially performed in accordance with the progress of the process simulation of the post-process pattern 32.

Specifically, when the top surface of the insulating film is set to the dimension prediction point, the opening angles at the dimension prediction point are calculated, and by using the opening angles, the shape of the post-process pattern 32 when the insulating film is processed to a predetermined depth (the halfway processed post-process pattern 32) is predicted. Thereafter, the dimension prediction point is set on the top surface of the halfway processed post-process pattern 32, the opening angles at the dimension prediction point are calculated, and by using the opening angles, the shape of the post-process pattern 32 when the insulating film is further processed to a predetermined depth (the halfway processed post-process pattern 32) is predicted.

In the post-process dimension calculation apparatus 1, the setting processing of the dimension prediction point onto the halfway processed post-process pattern 32 predicted by the post-process dimension calculator 16, the calculation processing of the opening angles, and the shape prediction processing of the post-process pattern 32 when the halfway processed post-process pattern 32 is further processed are repeated until the processed depth reaches a desired depth. Thus, when the dimension prediction point is set onto the halfway processed post-process pattern 32, the opening angle calculator 15 calculates the opening angles at the dimension prediction point by using the shape of the resist pattern 33 and the shape of the halfway processed post-process pattern 32.

The output unit 19 outputs info nation (prediction result) related to the shape of the post-process pattern 32 (the insulating film etched to a predetermined position) predicted by the post-process dimension calculator 16 to an external apparatus as the post-process dimensions. The output unit 19 may outputs the dimension conversion difference due to the etching. The dimension conversion difference may be a shape difference (dimension difference) between the design pattern and the post-process pattern 32 or may be a shape difference between the resist pattern 33 and the post-process pattern 32. The dimension conversion difference is calculated on the basis of the prediction result of the post-process dimensions.

The pattern information described in this embodiment may be information related to the shape of the resist pattern 33 that is a mask of the post-process pattern 32. In this case, the mask member shape calculator 14 is not necessary.

Figure 3:
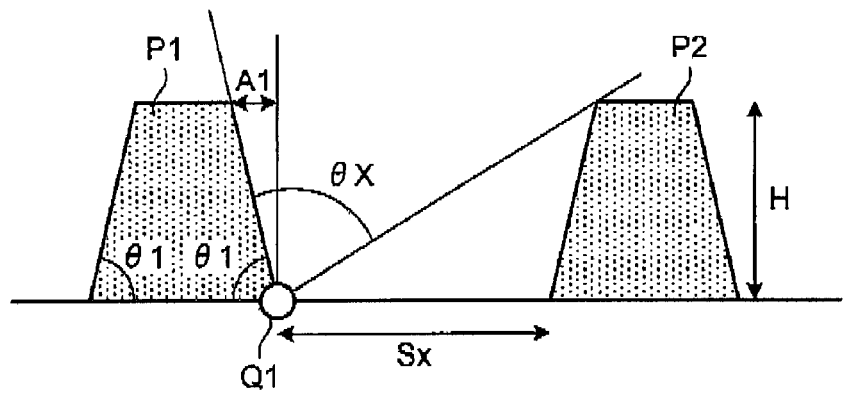
FIG. 3 is a diagram for explaining shape prediction processing according to the first embodiment.

Next, the opening angle used in this embodiment will be described. FIG. 3 is a diagram for explaining the shape prediction processing according to the first embodiment. FIG. 3 illustrates cross-sectional shapes of mask members P1 and P2. The mask members P1 and P2 form a layer of a mask for forming the post-process pattern 32 and correspond to the above-described resist pattern 33.

When the height of the mask members P1 and P2 is H, an angle of the mask members P1 and P2 with respect to the substrate (internal angle between the side surface of the mask member P1 and the top surface of the insulating film) (inclined angle) is $\theta 1$, and the distance from the mask member P1 to the mask member P2 adjacent to the mask member P1 (distance between the bottom surfaces) is Sx, the opening angle $\theta X$ at the dimension prediction point Q1 set at the bottom of the mask member P1 is calculated by using the formula (1) described below. The distance A1 between the vertical line (line perpendicular to the substrate) extended from the dimension prediction point Q1 and the mask member P1 on the top surface of the mask member P1 has a relationship of the formula (2).

[Formula 1]

$$\theta X = \arctan\left(\frac{Sx + A1}{H}\right) + \arctan\left(\frac{A1}{H}\right) \quad (1)$$

[Formula 2]

$$A1 = H \times \tan(90 - \theta 1) \quad (2)$$

Although a case in which the dimension prediction point Q1 is set at the bottom of the mask member P1 is described, the dimension prediction point Q1 may be set at the bottom of the mask member P2. In this case, the opening angle $\theta X$ can be also calculated by using the formula (1) and the formula (2).

Next, the post-process dimension prediction method using the opening angle $\theta X$ will be described. The opening angle calculator 15 obtains the opening angle $\theta X$ by using the formula (1) and the formula (2). In this case, the opening angle $\theta X$ can be a function with variables of the distance Sx, the height H, and the distance A1. Therefore, an opening angle as a solid angle including the opening angle $\theta X$ which is a plain angle can be a function $\theta$ (Sx, H, A1) with a variable of the height H. As a result, for example, a post-process dimension CD can be represented by a function formula such as, post-process dimension CD=$\alpha$+$\beta$×opening angle $\theta$(Sx, H, A1).

Here, $\alpha$ and $\beta$ are coefficients and can be determined by a regression analysis method described below. When determining the coefficients $\alpha$ and $\beta$ by the regression analysis method, the method of least squares can be used. Specifically, the coefficients α and β are obtained so that the root mean square of a difference between an actual measured value (experimental value) and a calculated value of the post-process dimension is minimum. In this case, the above-described calculation may be performed by selecting the height H so that the difference between the actual measured value and the calculated value is minimum.

Although the regression analysis method, which is a kind of multivariate analysis technique, is exemplified here as a method for analyzing α and β, it is not limited to the regression analysis method. For example, it is possible to make a compact model by analyzing a correlation between an opening angle and an actual measured value of the post-process dimension by means of multivariate analysis technique or response surface methodology and perform the post-process dimension prediction under various specific conditions on the basis of the model.

Although, in this embodiment, a case in which incident particles such as radicals and ions vertically proceed to the top surface of the substrate is described, the shape of the post-process pattern 32 may be predicted by considering the incident angle of the incident particles with respect to the top surface of the substrate. Here, the shape prediction processing in a case in which the incident particles such as ions obliquely proceed to the top surface of the substrate by an influence of a curve of sheath (plasma potential surface) will be described.

Figure 4:
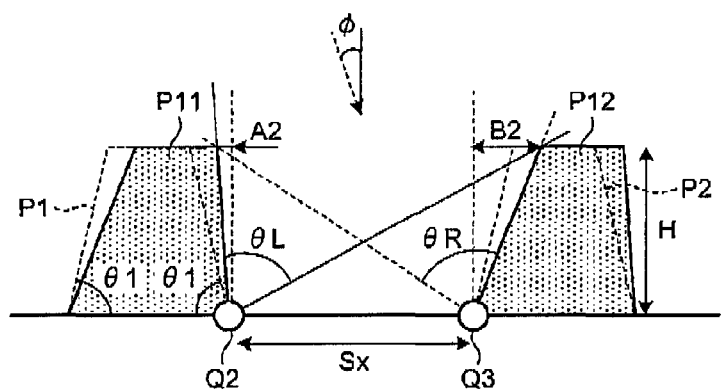
FIG. 4 is a diagram for explaining shape prediction processing according to the first embodiment when incident particles proceed to a substrate at an incident angle in an oblique direction.

FIG. 4 is a diagram for explaining the shape prediction processing according to the first embodiment when incident particles proceed to the substrate at an incident angle in an oblique direction. In FIG. 4, the incident angle of the incident particles with respect to the top surface of the substrate is indicated by φ.

When the incident particles proceed to the top surface of the substrate at an incident angle φ, the mask members P1 and P2 can be handled as mask members P11 and P12 which are obtained by tilting the mask members P1 and P2 by an angle corresponding to φ in the cross-sectional surface. Here, the mask members P11 and P12 have shapes in which the bottom surfaces of the mask members P1 and P2 are fixed, the height H is maintained, and the top surfaces are shifted in an inner surface direction.

Specifically, of the side surfaces of the mask members P1 and P2 illustrated in FIG. 4, side surfaces where the incident angle of the incident particles increases by φ due to the incident angle φ is tilted from the angle θ1 to the angle (θ1−φ) to form one side surfaces of the mask members P11 and P12 (left side surfaces of the mask members P1 and P2). On the other hand, side surfaces whose incident angle of the incident particles decreases by φ is tilted from the angle θ1 to the angle (θ1+φ) to form the other side surfaces of the mask members P11 and P12 (right side surfaces of the mask members P1 and P2).

The opening angle θL at the dimension prediction point Q2 set at the bottom right end of the mask member P11 is calculated by using the formula (3) described below. The opening angle θR at the dimension prediction point Q3 set at the bottom left end of the mask member P12 is calculated by using the formula (4) described below. On the top surface of the mask member P1, the distance A2 between the vertical line (line perpendicular to the substrate) extended from the dimension prediction point Q2 and right end of the mask member P11 has a relationship of the formula (5) and the distance B2 between the vertical line (line perpendicular to the substrate) extended from the dimension prediction point Q3 and left end of the mask member P12 has a relationship of the formula (6).

[Formula 3]
$$\theta L = \arctan\left(\frac{Sx + B2}{H}\right) + \arctan\left(\frac{A2}{H}\right) \quad (3)$$

[Formula 4]
$$\theta R = \arctan\left(\frac{Sx + A2}{H}\right) + \arctan\left(\frac{B2}{H}\right) \quad (4)$$

[Formula 5]
$$A2 = H \times \tan(90 - \theta 1 - \phi) \quad (5)$$

[Formula 6]
$$B2 = H \times \tan(90 - \theta 1 + \phi) \quad (6)$$

After the opening angles are calculated, the post-process dimension calculator 16 calculates the post-process dimensions by using the opening angle θX and the opening angles θL and θR. On the basis of values of the post-process dimensions obtained as described above, it is possible to detect a hot spot at which the post-process pattern 32 becomes a defective spot at a rate greater than a predetermined value. When a hot spot is detected, pattern modification of the photomask, correction of the design pattern (space width and the like), dimension change of the processed film (insulating film), and the like are performed on the basis of the values of the post-process dimensions. These correction and change are performed by changing at least one of the mask pattern, the design layout, and exposure condition of an exposure apparatus. The exposure condition includes, for example, an amount of exposure, illumination intensity, shape correction, opening angle of the lens (NA), exposure wavelength, lens aberration, polarization degree, and the like.

Thereafter, a photomask is formed by using a mask pattern modified as needed. Then, a semiconductor device (semiconductor integrated circuit) is manufactured by using the photomask in the wafer process. Specifically, an exposure apparatus performs exposure processing on a wafer by using the photomask, and thereafter, development processing and etching processing of the wafer are performed. In other words, the insulating film, which is a film to be processed, is patterned by etching by using a resist pattern formed by transfer in a lithography process as a mask member. When manufacturing a semiconductor device, the above described exposure processing, development processing, and etching processing are repeated for each layer.

Although, in this embodiment, a case in which the post-process pattern 32 is a pattern of line and space is described, the post-process pattern 32 may be a pattern of contact hole.

As described above, in this embodiment, the opening angle corresponding to the shape of the resist pattern 33 which is actually formed on the substrate is calculated, so that a correct opening angle can be calculated. Based on this, it is possible to improve the accuracy of the process simulation (post-process dimension prediction) regardless of the shape of the pattern, so that an appropriate process conversion difference correction can be performed. Therefore, it is possible to prevent degradation of electric characteristics caused by the process conversion difference included in the shape of the post-process pattern 32 and breaks and bridges in the post-process pattern 32 from occurring. As a result, quality and productivity of the semiconductor device can be improved. In addition, a hot spot or the like can be appropriately detected, so that verification accuracy of the design data can be improved.

The pattern information described in this embodiment may be information related to the shape of the resist pattern 33 that is a mask of the post-process pattern 32. In this case, the mask member shape calculator 14 is not necessary.

As described above, according to the first embodiment, an opening angle corresponding to the taper shape of the mask members P1 and P2 or the mask members P11 and P12 is set at a dimension prediction point, so that the post-process dimension of the pattern can be predicted at a high degree of accuracy regardless of the shape of the pattern. Further, the shape of the post-process pattern 32 is predicted by considering the incident angle of the incident particles with respect to the top surface of the substrate, so that the post-process dimension corresponding to the etching processing can be predicted at a high degree of accuracy.

(Second Embodiment)

Next, a second embodiment of the present invention will be described with reference to FIGS. 5 to 11. In the second embodiment, the post-process dimension prediction processing is applied to a side wall processing process. In the side wall processing process, the side wall pattern after removing a core member has a left-right asymmetric shape, so that when the post-process pattern 32 is formed by using the side wall pattern as a mask, the post-process pattern 32 also has a left-right asymmetric shape. In this embodiment, a process simulation of the side wall processing process using a left-right asymmetric mask member and a process simulation considering that ions enter in an oblique direction by an influence of a sheath curve will be described.

In this embodiment, the mask member shape calculator 14 predicts the shape of the side wall pattern on the basis of the pattern information, the lithography condition information, and the process condition information. The shape of the side wall pattern predicted by the mask member shape calculator 14 is a solid shape including both of a shape of the side wall pattern as seen from above the top surface and a cross-sectional shape of the side wall pattern.

Figure 5:
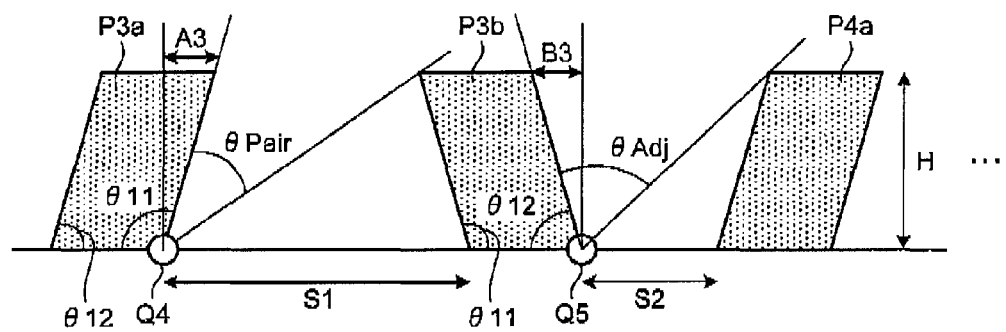
FIG. 5 is a diagram for explaining shape prediction processing according to a second embodiment.

In the side wall process, the side wall pattern is formed on the side wall of the core member, and the side wall pattern remains on the substrate when the core member is removed. FIG. 5 is a diagram for explaining the shape prediction processing according to the second embodiment. Here, the shape prediction processing when the post-process pattern is formed by using the side wall pattern will be described with reference to FIG. 5. FIG. 5 illustrates cross-sectional shapes of side wall patterns P3a, P3b, and P4a, which are mask members. The side wall patterns P3a, P3b, and P4a form a layer which works as a mask when the post-process pattern 32 is formed, and correspond to the above-described mask members P1 and P2.

The side wall pattern is formed on both sides of the core members, so that two side wall patterns are formed from one core member. In FIG. 5, the side wall pattern P3a and the side wall pattern P3b are side wall patterns formed by using the same core member and form a pair of side wall patterns. The side wall patterns P3a and P3b respectively have a left-right asymmetric cross-sectional shape. A pair of the side wall pattern P3a and the side wall pattern P3b has a line symmetric shape with respect to the center line of the core member.

The right-side side surface of the wall pattern P3a is adjacent to the side wall pattern P3b to form a pair, so that the shape of the right-side (Pair-side) side surface of the post-process pattern 32 formed below the side wall pattern P3a is determined by the shape and arrangement position of the side wall pattern P3b, the position of the dimension prediction point Q4 set at the bottom right end of the side wall pattern P3a, and the like.

The dimension prediction point Q4 set at the bottom right end of the side wall pattern P3a is a point for calculating an opening angle θpair with respect to the side wall pattern P3b. In the description here, the internal angle (inclined angle at the Pair-side) between the right-side side wall of the side wall pattern P3a (inner side wall facing the core member) and the top surface of the insulating film and the internal angle (inclined angle at the Pair side) between the left-side side wall of the side wall pattern P3b (inner side wall facing the core member) and the top surface of the insulating film are respectively defined as θ11.

The right-side side surface of the wall pattern P3b is adjacent to the side wall pattern P4a that does not form a pair, so that the shape of the right-side (Adj-side) side surface of the post-process pattern 32 formed below the side wall pattern P3b is determined by the shape and arrangement position of the side wall pattern P4a, the position of the dimension prediction point Q5 set at the bottom right end of the side wall pattern P3b, and the like.

The dimension prediction point Q5 set at the bottom right end of the side wall pattern P3b is a point for calculating an opening angle θAdj with respect to the side wall pattern P4a. In the description here, the internal angle (side wall angle at the adj-side) between the left-side side wall of the side wall pattern P3a (outer side wall opposite to the core member) and the top surface of the insulating film and the internal angle (side wall angle at the adj-side) between the right-side side wall of the side wall pattern P3b (outer side wall opposite to the core member) and the top surface of the insulating film are respectively defined as θ12.

The side wall angles of the side wall patterns P3a and P3b at the Pair-side are defined as θ11, the side wall angles of the side wall patterns P3a and P3b at the adj-side are defined as θ12, the space between the side wall patterns P3a and P3b that forms a pair is defined as S1, and the space between the side wall patterns P3b and P4a that do not form a pair but are adjacent to each other is defined as S2. In this case, the opening angle θpair at the Pair-side can be calculated by using the formula (7). The opening angle θAdj at the Adj-side can be calculated by using the formula (9). The distance A3 between the vertical line extended from the dimension prediction point Q4 and the right end of the side wall pattern P3a on the top surface of the side wall pattern P3a has a relationship of the formula (8). The distance B3 between the vertical line extended from the dimension prediction point Q5 and the right end of the side wall pattern P3b on the top surface of the side wall pattern P3b has a relationship of the formula (10).

[Formula 7]

$$\theta_{pair} = \arctan\left(\frac{S1 - A3}{H}\right) - \arctan\left(\frac{A3}{H}\right) \quad (7)$$

[Formula 8]

$$A3 = H \times \tan(\theta 11 - 90) \quad (8)$$

[Formula 9]

$$\theta_{adj} = \arctan\left(\frac{S2 + B3}{H}\right) + \arctan\left(\frac{B3}{H}\right) \quad (9)$$

[Formula 10]

$$B3 = H \times \tan(90 - \theta 12) \quad (10)$$

The shape of the post-process pattern 32 below the left of the side wall pattern P3b can be predicted by a calculation processing similar to that for the post-process pattern 32 below the right of the side wall pattern P3*a*. The shape of the post-process pattern 32 below the left of the side wall pattern P3*a* can be predicted by a calculation processing similar to that for the post-process pattern 32 below the right of the side wall pattern P3*b*.

As described above, when the side wall patterns P3*a* and P3*b* are left-right asymmetric, if dry etching is performed from above the side wall patterns P3*a* and P3*b*, incident particles such as ions enter in an oblique direction with respect to the side wall patterns P3*a* and P3*b* by an influence of a curve of sheath. Based on this, a left-right asymmetric post-process pattern 32, which is called "odd-even difference", tends to be formed after the etching. Therefore, the shape of the post-process pattern 32 may be predicted by considering the incident angle of the incident particles with respect to the top surface of the substrate. Here, the shape prediction processing in a case in which the incident particles such as ions obliquely proceed to the top surface of the substrate by an influence of a sheath curve will be described.

Figure 6A:
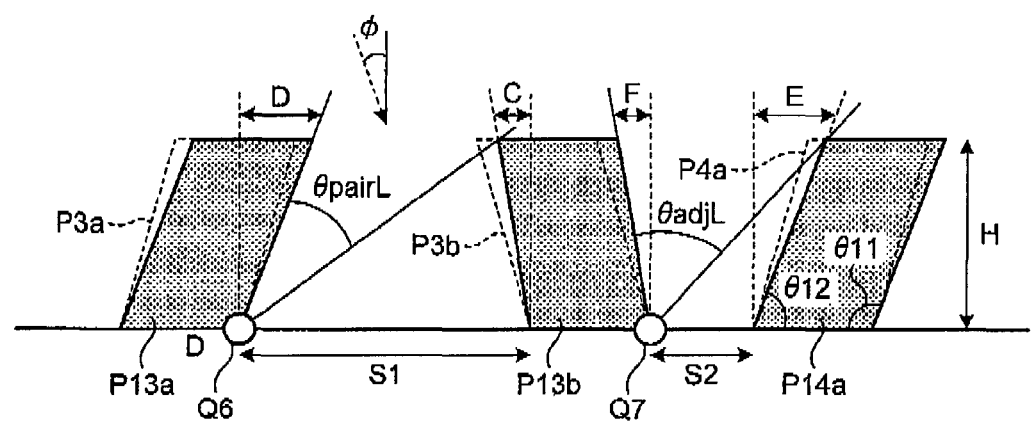
FIGS. 6A and 6B are diagrams for explaining shape prediction processing according to the second embodiment when incident particles proceed to a substrate at an incident angle in an oblique direction.
Figure 6B:
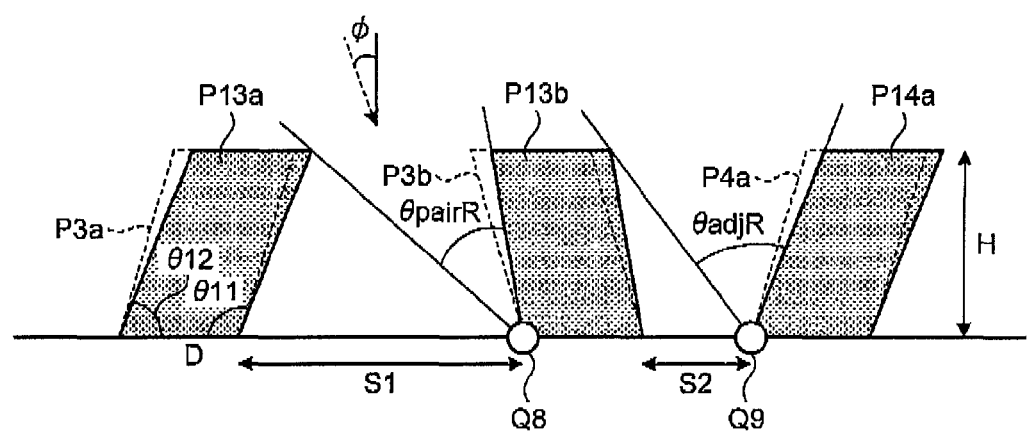

FIGS. 6A and 6B are diagrams for explaining the shape prediction processing according to the second embodiment when incident particles proceed to the substrate at an incident angle in an oblique direction. In FIGS. 6A and 6B, the incident angle of the incident particles with respect to the top surface of the substrate is indicated by $\phi$.

When the incident particles proceed to the top surface of the substrate at an incident angle $\phi$, the side wall patterns P3*a* and P3*b* can be handled as side wall patterns P13*a* and P13*b* which are obtained by tilting the side wall patterns P3*a* and P3*b* by an angle corresponding to $\phi$ in the cross-sectional surface. Here, the side wall patterns P13*a* and P13*b* have shapes in which the bottom surfaces of the side wall patterns P3*a* and P3*b* are fixed, the height H is maintained, and the top surfaces are shifted in an inner surface direction.

Specifically, of the side surfaces of the side wall pattern P3*a* illustrated in FIG. 6A, a side surface (left-side side surface) where the incident angle of the incident particles increases by $\phi$ due to the incident angle $\phi$ is tilted from the angle $\theta 12$ to the angle $(\theta 12 - \phi)$ to form one side surface of the side wall pattern P13*a*. Also, of the side surfaces of the side wall pattern P3*a*, a side surface (right-side side surface) where the incident angle of the incident particles decreases by $\phi$ due to the incident angle $\phi$ is tilted from the angle $\theta 11$ to the angle $(\theta 11 + \phi)$ to form the other surface of the side wall pattern P13*a*.

Similarly, of the side surfaces of the side wall pattern P3*b* illustrated in FIG. 6B, a side surface (left-side side surface) where the incident angle of the incident particles increases by $\phi$ due to the incident angle $\phi$ is tilted from the angle $\theta 11$ to the angle $(\theta 11 - \phi)$ to form one side surface of the side wall pattern P13*b*. Similarly, of the side surfaces of the side wall pattern P3*b*, a side surface (right-side side surface) where the incident angle of the incident particles decreases by $\phi$ due to the incident angle $\phi$ is tilted from the angle $\theta 12$ to the angle $(\theta 12 + \phi)$ to form the other surface of the side wall pattern P13*b*.

The opening angle $\theta$pairL at the dimension prediction point Q6 set at the bottom right end (Pair-side) of the side wall pattern P13*a* is calculated by using the formula (11) described below. The opening angle $\theta$pairR at the dimension prediction point Q8 set at the bottom left end (Pair-side) of the side wall pattern P13*b* is calculated by using the formula (13) described below. The distance C between the vertical line (line perpendicular to the substrate) extended from the dimension prediction point Q8 and the left end of the side wall pattern P13*b* on the top surface of the side wall pattern P3*b* has a relationship of the formula (12). The distance D between the vertical line (line perpendicular to the substrate) extended from the dimension prediction point Q6 and the right end of the side wall pattern P13*a* on the top surface of the side wall pattern P3*a* has a relationship of the formula (14).

[Formula 11]
$$\theta_{pair}L = \arctan\left(\frac{S1-C}{H}\right) - \arctan\left(\frac{C}{H}\right) - 2\phi \qquad (11)$$

[Formula 12]
$$C = H \times \tan(\theta 11 - \phi - 90) \qquad (12)$$

[Formula 13]
$$\theta_{pair}R = \arctan\left(\frac{S1-D}{H}\right) - \arctan\left(\frac{D}{H}\right) + 2\phi \qquad (13)$$

[Formula 14]
$$D = H \times \tan(\theta 11 + \phi - 90) \qquad (14)$$

The opening angle $\theta$AdjL at the dimension prediction point Q7 set at the bottom right end (Adj-side) of the side wall pattern P13*b* is calculated by using the formula (15) described below. The opening angle $\theta$AdjR at the dimension prediction point Q9 set at the bottom left end (Adj-side) of the side wall pattern P13*a* is calculated by using the formula (17) described below. The distance E between the vertical line (line perpendicular to the substrate) extended from the dimension prediction point Q9 and the left end of the side wall pattern P14*a* in the side wall pattern P14*a* has a relationship of the formula (16). The distance F between the vertical line (line perpendicular to the substrate) extended from the dimension prediction point Q7 and the right end of the side wall pattern P13*b* on the top surface of the side wall pattern P13*b* has a relationship of the formula (18).

[Formula 15]
$$\theta_{adj}L = \arctan\left(\frac{S1+E}{H}\right) + \arctan\left(\frac{E}{H}\right) - 2\phi \qquad (15)$$

[Formula 16]
$$E = H \times \tan(90 - \theta 12 + \phi) \qquad (16)$$

[Formula 17]
$$\theta_{adj}R = \arctan\left(\frac{S1+F}{H}\right) + \arctan\left(\frac{F}{H}\right) + 2\phi \qquad (17)$$

[Formula 18]
$$F = H \times \tan(90 - \theta 12 - \phi) \qquad (18)$$

After the opening angle calculator 15 calculates the opening angles $\theta$L and $\theta$R and the opening angles $\theta$pairL, $\theta$pairR, $\theta$AdjL, and $\theta$AdjR, the post-process dimension calculator 16 calculates the post-process dimension of the post-process pattern 32 by using the calculated opening angles.

Here, a process flow of the side wall processing process will be described. FIG. 7 is a diagram illustrating the process flow of the side wall processing process. The side wall processing process is a process for forming a line pattern having the same pattern as that of the side wall pattern by transferring the side wall pattern to a lower layer. In FIG. 7, the upper side of the processes (s1) to (s7) show top views (of only the uppermost layer) when a pattern is formed and the lower side of the processes (s1) to (s7) show cross-sectional views when the pattern is formed.

In the side wall processing process, a pattern forming layer 51A to which the pattern is formed and a core member layer 52A for forming a core member in an upper layer of the pattern forming layer 51A are formed in upper layers of the substrate. Then a resist pattern 53A having a minimum processing width 2h is formed in an upper layer of the core member layer 52A by a lithography process (s1).

Thereafter, the core member layer 52A is etched (core member processing) by a Reactive Ion Etching (RIE) method or the like by using the resist pattern 53A as a mask to form a core member pattern 52B (s2). Then, slimming processing is performed on the core member pattern 52B to form a slimming pattern 52C (s3).

Next, a side wall deposit film 54A such as a nitride film is deposited on the substrate by a Chemical Vapor Deposition (CVD) method or the like (s4). Thereafter, the side wall deposit film 54A is etched back by anisotropic etching such as RIE to form a side wall pattern 54B from the side wall deposit film 54A (s5). The side wall pattern 54B here corresponds to the side wall patterns P13a, P13b, and P14a.

Then, the slimming pattern 52C is removed by wet-etching the slimming pattern 52C, and only the side wall pattern 54B is left on the pattern forming layer 51A (s6). Thereafter, the pattern forming layer 51A is etched by RIE or the like by using the side wall pattern 54B as a mask to form a line pattern 51B as the post-process pattern 32 (s7). In this way, the line pattern 51B having a line width h can be formed.

Figure 8A:
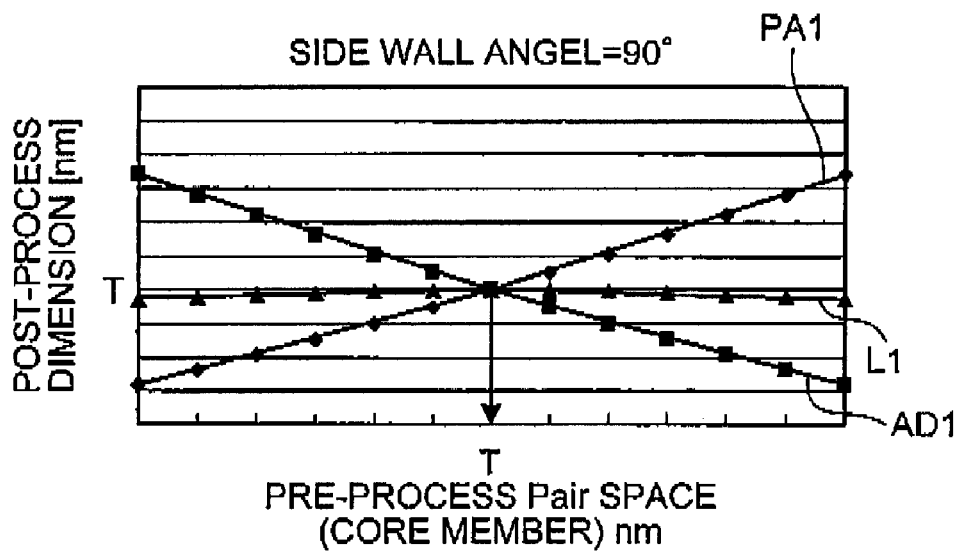
FIGS. 8A and 8B are diagrams for explaining a process simulation result when considering side wall angles of side wall patterns.
Figure 8B:
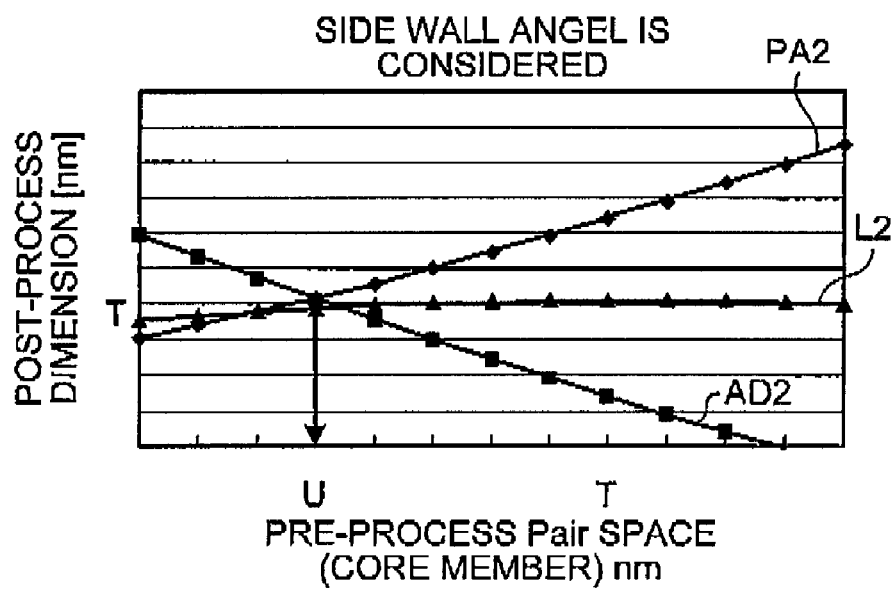

Next, by considering the side wall angles of the side wall patterns P3a and P3b, a simulation result of a process simulation of the post-process pattern 32 will be described. FIGS. 8A and 8B are diagrams for explaining a process simulation result when considering side wall angles of the side wall patterns. The process simulation result here is the dimensions of the post-process pattern 32 in a case in which the pitch of the side wall patterns P3a and P3b is set to a constant value and the pre-process dimension (pre-process Pair space) of the Pair-side space (core member) between the side wall patterns P3a and P3b is variously changed. The dimension of the entire side wall pattern (line width) is a constant value (T) and a sum of the dimension of the pre-process Pair space and the pre-process Adj space is a constant value (2T). As the dimensions of the post-process pattern 32, Pair-side space dimensions of the post-process pattern 32 (Pair post-process dimensions PA1 and PA2), adj-side space dimensions of the post-process pattern 32 (Adj post-process dimensions AD1 and AD2), and line width dimensions of the post-process pattern 32 (post-process line dimensions L1 and L2) are calculated.

In the two graphs illustrated in FIGS. 8A and 8B, the horizontal axis indicates the Pair-side space (pre-process Pair space) between the pre-process side wall patterns P3a and P3b and the vertical axis indicates the dimension of the post-process pattern 32 (post-process dimension). The graph illustrated in FIG. 8A indicates relationship between the pre-process dimensions and the post-process dimensions when performing the process simulation of the post-process pattern 32 by defining that the side wall angles of the side wall patterns P3a and P3b are 90°. The graph illustrated in FIG. 8B indicates relationship between the pre-process dimensions and the post-process dimensions when performing the process simulation of the post-process pattern 32 by considering the side wall angles of the side wall patterns P3a and P3b.

As illustrated in FIG. 8A, when the side wall angles of the side wall patterns P3a and P3b are 90°, if the pre-process Pair space is changed from a small dimension to a larger dimension, the Pair post-process space dimension PA1 changes from a small dimension to a large dimension. At this time, the Adj post-process space dimension AD1 changes from a large dimension to a small dimension and the post-process line dimension L1 is constant at a predetermined value (T).

Therefore, when the side wall angles of the side wall patterns P3a and P3b are 90°, if the pre-process Pair space is T, the Pair-side space dimension of the post-process pattern 32 and the adj-side space dimension of the post-process pattern 32 have the same value T and the post-process line dimension L1 is T.

On the other hand, as illustrated in FIG. 8B, when considering the side wall angles of the side wall patterns P3a and P3b, if the pre-process Pair space is changed from a small dimension to a larger dimension, the Pair post-process space dimension PA2 changes from a small dimension to a large dimension. At this time, the Adj post-process space dimension AD2 changes from a large dimension to a small dimension and the post-process line dimension L2 is constant at T.

Therefore, when the side wall angles of the side wall patterns P3a and P3b are considered, if the pre-process Pair space is U, the Pair-side space dimension of the post-process pattern 32 and the adj-side space dimension of the post-process pattern 32 have the same value T and the post-process line dimension L2 is T.

As described above, the process simulation results are different between a case in which the side wall angles of the side wall patterns P3a and P3b are 90° and a case in which the side wall angles of the side wall patterns P3a and P3b are considered. The dimensions of the post-process pattern 32 obtained by an actual experiment are nearer to the process simulation result of the case in which the side wall angles of the side wall patterns P3a and P3b are considered than the process simulation result of the case in which the side wall angles of the side wall patterns P3a and P3b are 90°. Therefore, in the case in which the side wall angles are considered, it is possible to calculate more accurate dimensions of the post-process pattern 32 than in the case in which the side wall angles are 90°.

Figure 9A:
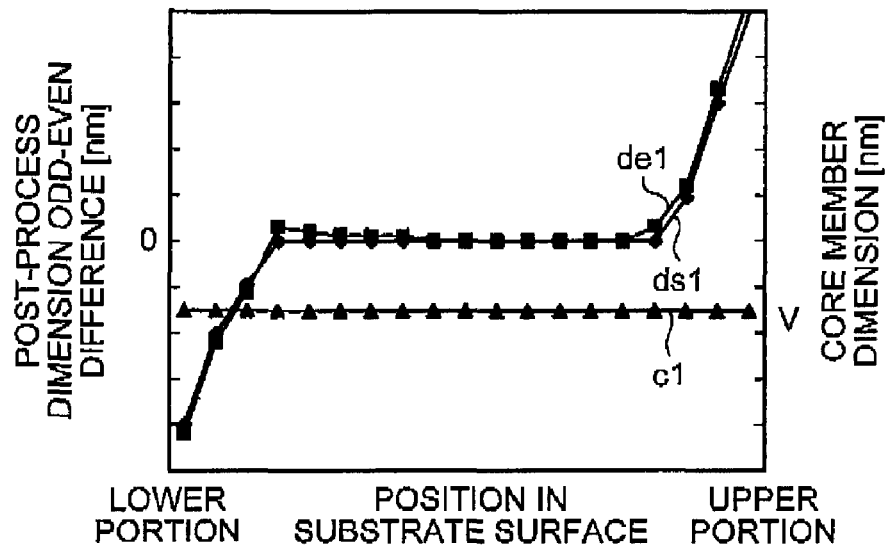
FIGS. 9A and 9B are diagrams for explaining a pattern correction when considering side wall angles of side wall patterns and ion incident angles.
Figure 9B:
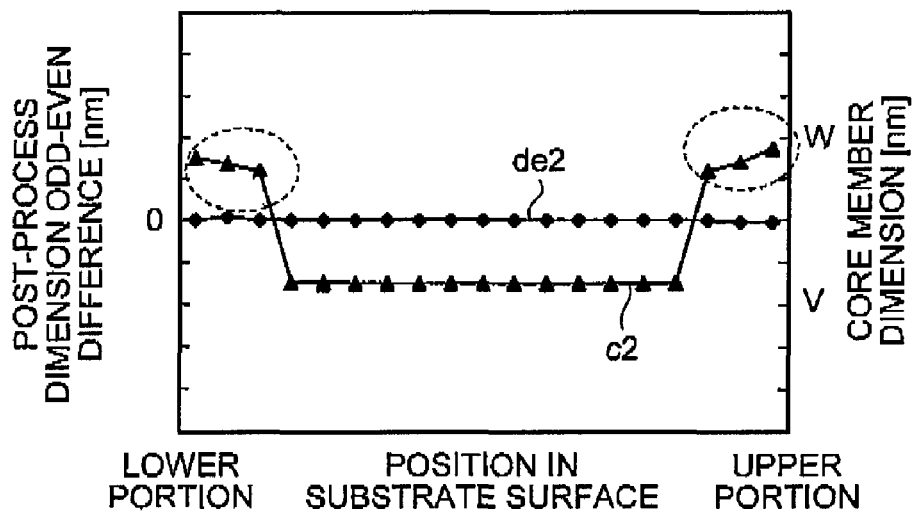

Next, the process simulation result in a case in which the side wall angle and an ion incident angle (sheath) are considered when predicting the dimensions of the post-process pattern 32 will be described. FIGS. 9A and 9B are diagrams for explaining a pattern correction when considering the side wall angle of the side wall pattern and an ion incident angle. In FIGS. 9A and 9B, the horizontal axis indicates the position of the post-process pattern 32 in a diameter direction on the substrate (distance from center of the substrate). The left side of the horizontal axis is the lower portion (notch portion) when the substrate is seen from above the top surface and the right side of the horizontal axis is the upper portion when the substrate is seen from above the top surface. The left side vertical axis indicates an odd-even difference of the post-process dimensions and the right side vertical axis indicates a core member dimension. The odd-even difference of the post-process dimensions is a dimension difference between a pair of post-process patterns 32 formed below the pair of side wall patterns P13a and P13b formed from one core member. In other words, a difference between the dimension of the post-process pattern 32 formed below the side wall pattern P13a and the dimension of the post-process pattern 32 formed below the side wall pattern P13b is the odd-even difference of the post-process dimensions.

As illustrated in FIG. 9A, when the core member dimension (pre-process Pair space) c1 is substantially constant (V) in the substrate, the odd-even difference de1 of the post-process dimension obtained by an experiment is approximately 0 at the center portion of the substrate. On the other hand, in the upper portion of the substrate surface, the nearer to the top of the substrate surface it is, the larger the value of the odd-even difference de1 is, and in the lower portion of the substrate surface, the nearer to the bottom of the substrate surface it is, the larger the value of the odd-even difference de1 is. The odd-even differences ds1 of the post-process dimensions obtained by the process simulation indicate approximately the same values as those of the odd-even differences de1.

When it is known that, the nearer to an end portion (top portion or bottom portion) on the substrate surface it is, the larger the odd-even difference is generated, as illustrated in FIG. 9B, the core member dimension c2 is corrected to dimensions (V to W) corresponding to the odd-even difference de1 or the odd-even difference ds1. Here, a case is illustrated in which, the nearer to an end portion in the substrate surface it is, the larger the core member dimension c2 is set, and the core member dimension c2 is set to small in the center portion of the substrate surface. The core member dimension c2 is corrected by using, for example, Optical Proximity Correction (OPC), Dose Mapper, or the like. In this way, the odd-even differences de2 of the post-process dimensions obtained by the process simulation have approximately constant values in the substrate surface.

Figure 10:
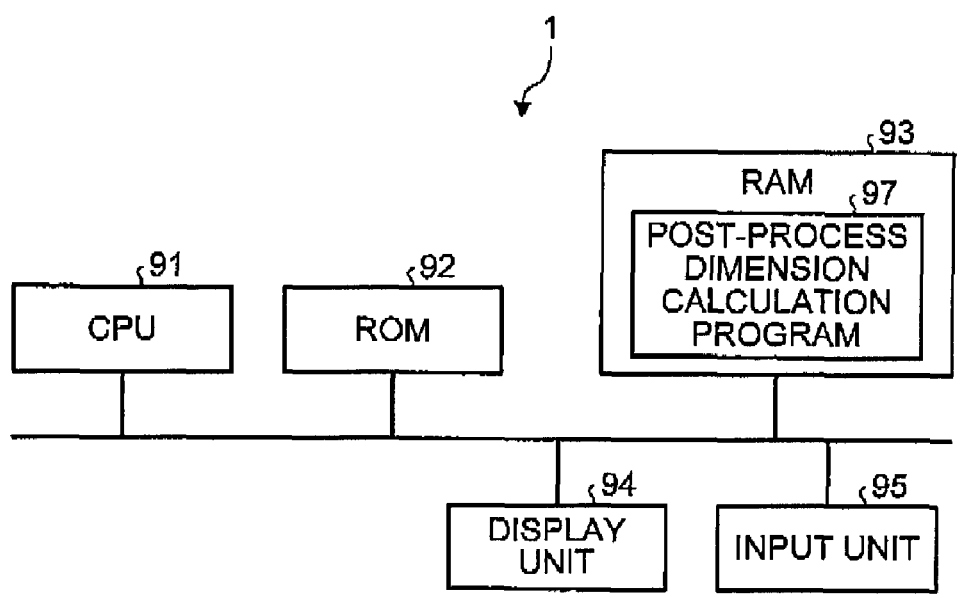
FIG. 10 is a diagram illustrating a hardware configuration of a post-process dimension calculation apparatus.

Next, a hardware configuration of the post-process dimension calculation apparatus 1 will be described. FIG. 10 is a diagram illustrating the hardware configuration of the post-process dimension calculation apparatus. The post-process dimension calculation apparatus 1 includes a Central Processing Unit (CPU) 91, a Read Only Memory (ROM) 92, a Random Access Memory (RAM) 93, a display unit 94, and an input unit 95. In the post-process dimension calculation apparatus 1, the CPU 91, the ROM 92, the RAM 93, the display unit 94, and the input unit 95 are connected to each other via a bus line.

The CPU 91 calculates the dimension of the post-process pattern 32 by using a post-process dimension calculation program 97 which is a computer program. The display unit 94 is a display apparatus such as a liquid crystal monitor and displays the pattern information, the lithography condition information, the process condition information, the information related to the shape of the resist pattern 33, the information related to the shape of the mask members P1, P2, P11, and P12, the information related to the shape of the side wall patterns P3a, P3b, P13a, and P13b, the information related to the opening angles, the dimension of the post-process pattern 32 (calculation result), and the like on the basis of an instruction from the CPU 91. The input unit 95 is configured to include a mouse and a keyboard and inputs instruction information (parameters necessary for calculating the dimension of the post-process pattern 32 and the like) input from outside by a user. The instruction information input into the input unit 95 is sent to the CPU 91.

The post-process dimension calculation program 97 is stored in the ROM 92 and loaded to the RAM 93 via the bus line. FIG. 10 illustrates a state in which the post-process dimension calculation program 97 is loaded in the RAM 93.

The CPU 91 executes the post-process dimension calculation program 97 loaded in the RAM 93. Specifically, in the post-process dimension calculation apparatus 1, the CPU 91 reads the post-process dimension calculation program 97 from the ROM 92, develops the post-process dimension calculation program 97 in an program storage area in the RAM 93, and executes various processing in accordance with an instruction input from the input unit 95 by a user. The CPU 91 temporarily stores various data generated when executing the various processing into a data storage area formed in the RAM 93.

The post-process dimension calculation program 97 executed in the post-process dimension calculation apparatus 1 has a module configuration including the mask member shape calculator 14, the opening angle calculator 15, and the post-process dimension calculator 16. These modules are loaded on a main storage device and these calculators are formed on the main storage device.

As described above, according to the second embodiment, an opening angle corresponding to the taper shape of the side wall patterns P3a and P3b or the side wall patterns P13a and P13b is set at a dimension prediction point, so that the post-process dimension of the pattern can be predicted at a high degree of accuracy regardless of the shape of the pattern. Further, the shape of the post-process pattern 32 is predicted by considering the incident angle of the incident particles with respect to the top surface of the substrate, so that the post-process dimension corresponding to the etching processing can be predicted at a high degree of accuracy.

As described above, according to the first and the second embodiments, the post-process dimension of the pattern can be predicted at a high degree of accuracy regardless of the pattern shape of the pre-process pattern and the post-process pattern.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern dimension calculation method, comprising:
    calculating, using a computer, a taper shape of a mask member used as a mask when a circuit pattern is processed in an upper layer of the circuit pattern formed on a substrate;
    calculating an opening angle facing the mask member from a shape prediction position on the circuit pattern on the basis of the taper shape; and
    calculating a dimension of the circuit pattern according to the opening angle formed at the shape prediction position.

2. The pattern dimension calculation method according to claim 1, wherein
    the opening angle is calculated by using a distance from a circuit pattern on which the shape prediction position is set to another circuit pattern adjacent to the circuit pattern, a dimension in a thick direction of the circuit pattern on which the shape prediction position is set, and a taper angle between the mask member and a top surface of the circuit pattern.

3. The pattern dimension calculation method according to claim 2, wherein
    the distance to the other circuit pattern and the dimension in the thick direction of the circuit pattern are calculated by using a design pattern of the circuit pattern formed on the substrate, a film thickness of the mask member, and a film thickness of the circuit pattern formed on the substrate.

4. The pattern dimension calculation method according to claim 2, wherein
the mask member is a pair of side wall patterns formed from one core member by a side wall process,
the taper angle is a first angle between an inner side wall surface facing the core member of side wall surfaces of the pair of side wall patterns and the top surface of the circuit pattern or a second angle between an outer side wall surface opposite to the core member of side wall surfaces of the pair of side wall patterns and the top surface of the circuit pattern, and
the opening angle is calculated by using the first angle at the shape prediction position set at a lower portion of the inner side wall surface, and the opening angle is calculated by using the second angle at the shape prediction position set at a lower portion of the outer side wall surface.

5. The pattern dimension calculation method according to claim 4, wherein
the taper angle is calculated separately for one side wall pattern and the other side wall pattern of the pair of side wall patterns.

6. The pattern dimension calculation method according to claim 2, wherein
when the opening angle is calculated, a distance between a line extended perpendicular to the substrate surface from the shape prediction position and the top surface of the mask member is calculated as a mask member distance by using the taper angle, and
the opening angle is calculated by using the mask member distance.

7. The pattern dimension calculation method according to claim 1, wherein
the mask is a resist, and
the taper shape of the mask member is calculated by using at least one of a coating condition of the resist, a material of the resist, an exposure condition to expose a substrate on which the resist is coated, and a development condition of the substrate.

8. The pattern dimension calculation method according to claim 1, wherein
the dimension of the circuit pattern is calculated by using at least one of a type of etchant and an etching time which are etching conditions for forming the circuit pattern.

9. The pattern dimension calculation method according to claim 1, wherein
the opening angle is calculated by using an incident angle of incident particles entering the mask member when the circuit pattern is processed.

10. The pattern dimension calculation method according to claim 1, wherein
the opening angle includes both of a first opening angle when the mask is seen from the above and a second opening angle when the mask is seen in a direction perpendicular to a cross section of the mask.

11. A computer program product comprising a non-transitory computer-readable recording medium including a plurality of computer-executable commands configured to calculate a circuit pattern dimension, wherein the plurality of commands causes a computer to execute the steps of:
calculating a taper shape of a mask member used as a mask when a circuit pattern is processed in an upper layer of the circuit pattern formed on a substrate;
calculating an opening angle facing the mask member from a shape prediction position on the circuit pattern on the basis of the taper shape; and
calculating a dimension of the circuit pattern according to the opening angle formed at the shape prediction position.

12. The computer program product according to claim 11, wherein
the opening angle is calculated by using a distance from a circuit pattern on which the shape prediction position is set to another circuit pattern adjacent to the circuit pattern, a dimension in a thick direction of the circuit pattern on which the shape prediction position is set, and a taper angle between the mask member and a top surface of the circuit pattern.

13. The computer program product according to claim 12, wherein
the distance to the other circuit pattern and the dimension in the thick direction of the circuit pattern are calculated by using a design pattern of the circuit pattern formed on the substrate, a film thickness of the mask member, and a film thickness of the circuit pattern formed on the substrate.

14. The computer program product according to claim 12, wherein
the mask member is a pair of side wall patterns formed from one core member by a side wall process,
the taper angle is a first angle between an inner side wall surface facing the core member of side wall surfaces of the pair of side wall patterns and the top surface of the circuit pattern or a second angle between an outer side wall surface opposite to the core member of side wall surfaces of the pair of side wall patterns and the top surface of the circuit pattern, and
the opening angle is calculated by using the first angle at the shape prediction position set at a lower portion of the inner side wall surface, and the opening angle is calculated by using the second angle at the shape prediction position set at a lower portion of the outer side wall surface.

15. The computer program product according to claim 14, wherein
the taper angle is calculated separately for one side wall pattern and the other side wall pattern of the pair of side wall patterns.

16. The computer program product according to claim 12, wherein
when the opening angle is calculated, a distance between a line extended perpendicular to the substrate surface from the shape prediction position and the top surface of the mask member is calculated as a mask member distance by using the taper angle, and
the opening angle is calculated by using the mask member distance.

17. The computer program product according to claim 11, wherein
the mask is a resist, and
the taper shape of the mask member is calculated by using at least one of a coating condition of the resist, a material of the resist, an exposure condition to expose a substrate on which the resist is coated, and a development condition of the substrate.

18. The computer program product according to claim 11, wherein
the dimension of the circuit pattern is calculated by using at least one of a type of etchant and an etching time which are etching conditions for forming the circuit pattern.

19. The computer program product according to claim 11, wherein
the opening angle is calculated by using an incident angle of incident particles entering the mask member when the circuit pattern is processed.

20. The computer program product according to claim 11, wherein
the opening angle includes both of a first opening angle when the mask is seen from the above and a second opening angle when the mask is seen in a direction perpendicular to a cross section of the mask.

* * * * *